(12) United States Patent
Takegami et al.

(10) Patent No.: US 12,072,383 B2
(45) Date of Patent: Aug. 27, 2024

(54) CHARACTERISTIC ESTIMATION DEVICE FOR STORAGE BATTERY AND CHARACTERISTIC ESTIMATION METHOD FOR STORAGE BATTERY

(71) Applicant: Mitsubishi Electric Corporation, Tokyo (JP)

(72) Inventors: Tomoki Takegami, Tokyo (JP); Toshihiro Wada, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 426 days.

(21) Appl. No.: 17/431,430

(22) PCT Filed: Apr. 11, 2019

(86) PCT No.: PCT/JP2019/015727
§ 371 (c)(1),
(2) Date: Aug. 17, 2021

(87) PCT Pub. No.: WO2020/208762
PCT Pub. Date: Oct. 15, 2020

(65) Prior Publication Data
US 2022/0155375 A1    May 19, 2022

(51) Int. Cl.
*G01R 31/36* (2020.01)
*G01R 31/367* (2019.01)
(Continued)

(52) U.S. Cl.
CPC ....... *G01R 31/367* (2019.01); *G01R 31/3842* (2019.01); *H01M 10/48* (2013.01)

(58) Field of Classification Search
CPC ............. G01R 31/367; G01R 31/3842; H01M 10/425; H01M 10/48; Y02E 60/10
See application file for complete search history.

(56) References Cited

U.S. PATENT DOCUMENTS 7,525,284 B2  4/2009  Iwane et al.
8,078,416 B2  12/2011  Iwane et al.
(Continued)

FOREIGN PATENT DOCUMENTS

| JP | 4015128 B2 | 11/2007 |
| JP | 2008-243373 A | 10/2008 |
| JP | 5170876 B2 | 3/2013 |

OTHER PUBLICATIONS

English Translation of the Incoming Written Opinion of the International Search Authority (Year: 2019).*

(Continued)

*Primary Examiner* — Mi'schita' Henson
(74) *Attorney, Agent, or Firm* — XSENSUS LLP

(57) ABSTRACT

Provided is a characteristic estimation device for a storage battery including: a voltage detection unit configured to detect a terminal voltage of the storage battery; a time-series data acquisition unit configured to acquire time-series data on the terminal voltage in a stopped state of the storage battery; a model provision unit configured to provide a storage battery model; and a model parameter estimation unit configured to estimate a model parameter of the storage battery model based on the time-series data on the terminal voltage acquired by the time-series data acquisition unit and on the storage battery model provided by the model provision unit. The storage battery model includes an OCV term for expressing OCV of the storage battery and an interparticle diffusion term which is based on a fundamental solution of a one-dimensional diffusion equation expressing ion diffusion among particles forming electrodes of the storage battery.

17 Claims, 10 Drawing Sheets

(51) Int. Cl.
*G01R 31/3842* (2019.01)
*H01M 10/48* (2006.01)

(56) References Cited

U.S. PATENT DOCUMENTS

| | | | | |
|---|---|---|---|---|
| 8,093,902 | B2 | 1/2012 | Nishi et al. | |
| 2003/0099884 | A1* | 5/2003 | Chiang | H01G 11/28 |
| | | | | 429/231.95 |
| 2014/0197805 | A1* | 7/2014 | Greening | H01M 50/00 |
| | | | | 320/162 |
| 2014/0333317 | A1* | 11/2014 | Frost | G01R 31/3842 |
| | | | | 324/430 |
| 2023/0014689 | A1* | 1/2023 | Ogasawara | G01R 31/392 |

OTHER PUBLICATIONS

International Search Report and Written Opinion mailed on Jul. 16, 2019, received for PCT Application PCT/JP2019/015727, Filed on Apr. 11, 2019, 9 pages including English Translation.

\* cited by examiner

IMAGE OF
SINGLE PARTICLE
MODEL

EQUIVALENT CIRCUIT OF
SINGLE PARTICLE MODEL

ONE-DIMENSIONAL
EQUIVALENT CIRCUIT MODEL

- ELECTRON RESISTANCES ARE NEGLECTED
- INTRAPARTICLE DIFFUSION IMPEDANCES
ARE SEPARATED AND CONNECTED IN SERIES

- OCVs ARE LINEARLY APPROXIMATED
(EXPRESSED BY CAPACITORS)
- PARTICLE IMPEDANCES ARE UNIFIED
INTO ONE IMPEDANCE

- DISTRIBUTED CONSTANT COMPONENTS ARE EXPRESSED AS DIFFUSION IMPEDANCE
- COMPONENTS OTHER THAN DIFFUSION COMPONENTS ARE UNIFIED INTO ONE DC RESISTOR

INTRAPARTICLE DIFFUSION: 3-DIMENSIONAL
INTERPARTICLE DIFFUSION: 1-DIMENSIONAL

MINUTE DISTANCE Δx

CHARACTERISTIC ESTIMATION DEVICE FOR STORAGE BATTERY AND CHARACTERISTIC ESTIMATION METHOD FOR STORAGE BATTERY

CROSS-REFERENCE TO RELATED APPLICATION

The present application is based on PCT filing PCT/JP2019/015727, filed Apr. 11, 2019, the entire contents of which are incorporated herein by reference.

TECHNICAL FIELD

The present invention relates to a characteristic estimation device for a storage battery and a characteristic estimation method for a storage battery, and more particularly, to a device and method for estimating a voltage relaxation process of a storage battery.

BACKGROUND ART

There have been proposed various models that express characteristics of a storage battery. For example, as a model that expresses a voltage relaxation process of the storage battery, there is known a multiple-series model including a large number of CR parallel elements, which is based on a general equivalent circuit of a storage battery having OCV (for example, see Patent Literature 1).

In Patent Literature 1, an electrochemical response of a storage battery is expressed through superimposition of first-order delay elements, and the voltage relaxation process of the storage battery is modeled as exponential function terms corresponding to a response exhibited in a stopped state of the CR parallel elements. Model parameters expressing the exponential function terms are estimated based on time-series data in the voltage relaxation process detected in the stopped state of the storage battery.

CITATION LIST

Patent Literature

[PTL 1] JP 5170876 B2

SUMMARY OF INVENTION

Technical Problem

However, there is a limit for the model described in Patent Literature 1 to highly precisely estimate the voltage relaxation process of the storage battery. For example, when the stopped state of the storage battery lasts for a short period, a voltage relaxation process having a short time constant is dominant. However, when the stopped state of the storage battery lasts for a long period, a voltage relaxation process having a longer time constant is dominant. As a result, for the model of Patent Literature 1, it is difficult to estimate model parameters expressing a voltage relaxation process in the long stopped state of the storage battery based on the time-series data detected in the short stopped period of the storage battery.

The present invention has been made to solve the above-mentioned problem, and has an object to provide a characteristic estimation device for a storage battery and a characteristic estimation method for a storage battery which are capable of highly precisely estimating a voltage relaxation process of a storage battery.

Solution to Problem

In order to solve the above-mentioned problem, according to one embodiment of the present invention, there is provided a characteristic estimation device for a storage battery including: a voltage detection unit configured to detect a terminal voltage of the storage battery; a time-series data acquisition unit configured to acquire time-series data on the terminal voltage in a stopped state of the storage battery; a model provision unit configured to provide a storage battery model that includes an OCV term for expressing OCV of the storage battery, and an interparticle diffusion term which is based on a fundamental solution of a one-dimensional diffusion equation expressing ion diffusion among particles forming an electrode of the storage battery; and a model parameter estimation unit configured to estimate a model parameter of the storage battery model based on the time-series data on the terminal voltage acquired by the time-series data acquisition unit and on the storage battery model provided by the model provision unit.

Further, according to one embodiment of the present invention, there is provided a characteristic estimation method for a storage battery including the steps of: detecting a terminal voltage of the storage battery; acquiring time-series data on the terminal voltage in a stopped state of the storage battery; providing a storage battery model that includes an OCV term for expressing OCV of the storage battery, and an interparticle diffusion term which is based on a fundamental solution of a one-dimensional diffusion equation expressing ion diffusion among particles forming an electrode of the storage battery; and estimating a model parameter of the storage battery model based on the time-series data on the terminal voltage and on the storage battery model.

Advantageous Effects of Invention

According to the characteristic estimation device for a storage battery and the characteristic estimation method for a storage battery of the present invention, it is possible to highly precisely estimate the voltage relaxation process of the storage battery.

DESCRIPTION OF EMBODIMENTS

Now, details of an embodiment of the invention disclosed in the present application are described with reference to the accompanying drawings. It should be noted, however, that the embodiment described below is merely an example, and the present invention is not limited to the embodiment.

First Embodiment

Figure 1:
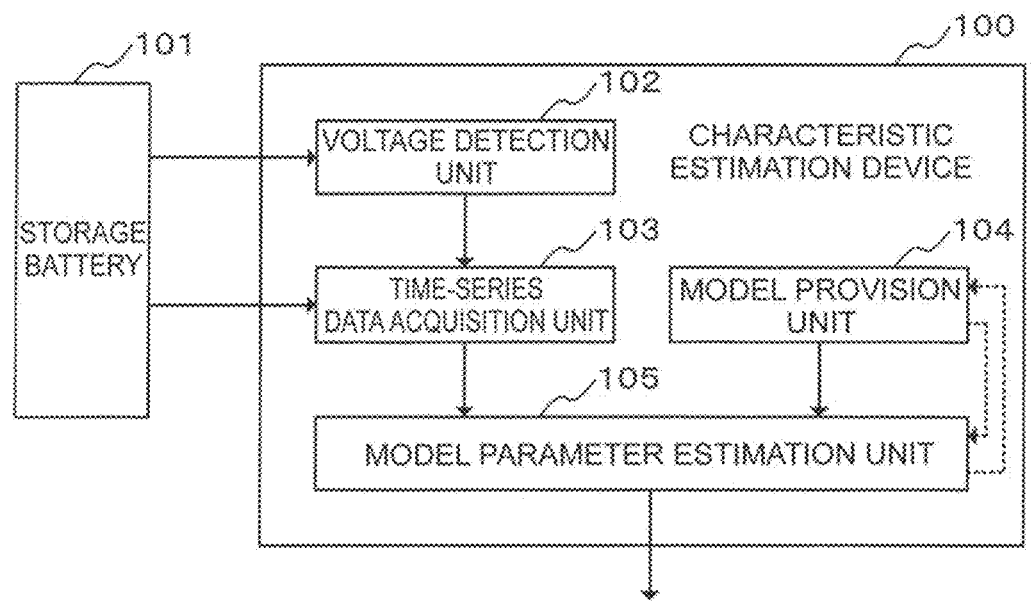
FIG. 1 is a block diagram for illustrating a configuration of a characteristic estimation device for a storage battery according to a first embodiment of the present invention.

FIG. 1 is a diagram for illustrating a configuration of a characteristic estimation device 100 for a storage battery according to a first embodiment of the present invention. In FIG. 1, a storage battery 101 connected to the characteristic estimation device 100 is also illustrated.

In the first embodiment, a lithium-ion storage battery is assumed as the storage battery 101. However, the storage battery 101 may be a lead storage battery, a nickel-hydrogen storage battery, a solid-state battery, a sodium-sulfur battery, a sodium-sulfur battery, a magnesium-ion battery, an electrical double layer, and the like.

The characteristic estimation device 100 includes a voltage detection unit 102, a time-series data acquisition unit 103, a model provision unit 104, and a model parameter estimation unit 105.

The voltage detection unit 102 is configured to detect a terminal voltage V of the storage battery 101.

The time-series data acquisition unit 103 is configured to acquire time-series data $\{(p, Vp)|p=0, 1, \ldots, m-1\}$ in a stopped state of the storage battery 101 based on the terminal voltage V of the storage battery 101 detected by the voltage detection unit 102.

Figure 2:
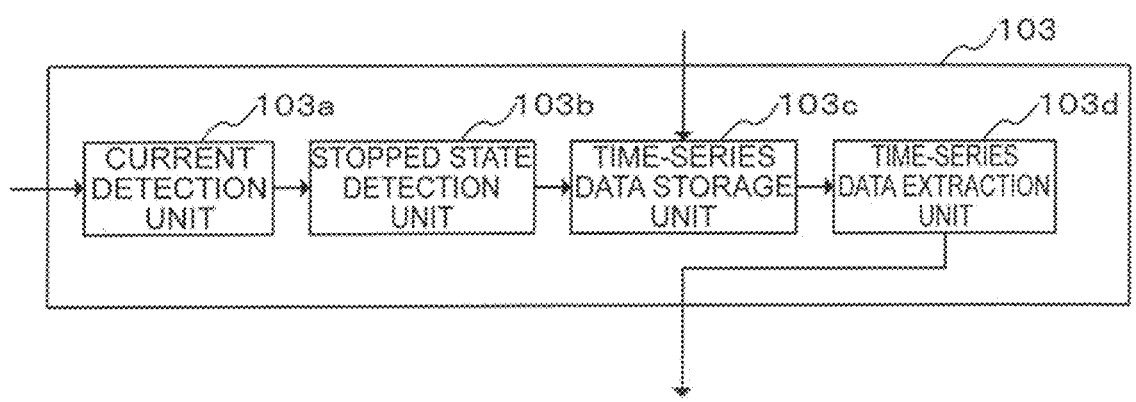
FIG. 2 is a block diagram for illustrating an internal configuration of a time-series data acquisition unit included in the characteristic estimation device of FIG. 1.

In more detail, as illustrated in FIG. 2, the time-series data acquisition unit 103 includes a current detection unit 103a, a stopped state detection unit 103b, a time-series data storage unit 103c, and a time-series data extraction unit 103d.

The current detection unit 103a is configured to detect a current I of the storage battery 101.

The stopped state detection unit 103b is configured to detect a stopped state of the storage battery 101 based on the current I of the storage battery 101 detected by the current detection unit 103a. The stopped state detection unit 103b is not required to detect only a state in which the storage battery 101 is completely stopped, but may detect also a state close to the stopped state. The state close to the stopped state of the storage battery 101 is hereinafter referred to as "semi-stopped state."

As a method of detecting the stopped state of the storage battery 101, for example, there can be employed a method of detecting a state in which "$|I|<\varepsilon$" and "$|\Delta I|<\delta$" are satisfied for minute values $\varepsilon$ and $\delta$ determined in advance. The symbol $\Delta I$ represents a differential value between the current I at a time "t" and the current I at a time $t-\Delta t$ immediately before.

In this detection method, even when the current I is not strictly zero due to a detection error of the current detection unit 103a, the stopped state can be detected based on the condition given by the first inequality "$|I|<\varepsilon$". Moreover, the above-mentioned "semi-stopped state" can be detected through setting of $\varepsilon$ to a large value.

Further, not only a magnitude of the current I, but also a change in the current I is considered based on the second inequality $|\Delta I|<\delta$, and thus the stopped state can more precisely be detected.

When a system to which the storage battery 101 is mounted independently detects the stopped state of the storage battery 101, the stopped state detection unit 103b may receive a detection signal from the system to detect the state time of the storage battery 101.

The time-series data storage unit 103c is configured to store time-series data $\{(k, Vk)|k=0, 1, \ldots, n\}$ of the terminal voltage V of the storage battery 101 detected by the voltage detection unit 102 during a period in which the stopped state detection unit 103b is detecting the stopped state of the storage battery 101. The symbol "k" represents a sampling time, and when the sampling cycle is "ts", there is established a relationship of "time t=k*ts". It is not always required to provide the time-series data storage unit 103c inside the time-series data acquisition unit 103. The time-series data storage unit 103c may be provided, for example, on a cloud.

The sampling cycle "ts" for storing the time-series data on the terminal voltage V may be determined by the time-series data storage unit 103c, or may be determined when the voltage detection unit 102 detects the terminal voltage V.

The time-series data extraction unit 103d is configured to remove unnecessary data from the time-series data $\{(k, Vk)|k=0, 1, \ldots, n-1\}$ stored in the time-series data storage unit 103c, to thereby extract required time-series data $\{(p, Vp)|p=0, 1, \ldots, m-1\}$.

The symbol "p" represents a value extracted from the time-series data of "k", and hence $p=0, 1, \ldots, m-1$ corresponds to $t=r_0*ts, r_1*ts, \ldots, r_{m-1}*ts$. That is, for a certain "p", a relationship of "t=rp*ts" is satisfied. The symbol "rp" represents a p-th piece of data of the extracted time-series data.

As a specific extraction method to be performed in the time-series data extraction unit 103d, it is conceivable, for example, to remove data in a first certain period from the original time-series data. This is because it is conceivable that there exists disturbance in an ion distribution inside the storage battery 101 depending on a past charge/discharge history at the beginning of the stopped state of the storage battery 101, and hence data at this beginning period may be inappropriate for estimating a voltage relaxation process.

Moreover, when there is an apparent absence of the data, the absence may be excluded. Further, sampling based on the voltage change may be executed, to thereby remove data having a small voltage change.

As described above, the time-series data {(p, Vp)|p=0, 1, . . . , m−1} is extracted from the original time-series data {(k, Vk)|k=0, 1, . . . , n−1} by removing the unnecessary data. Processing for such data extraction depends on restrictions imposed by the method of estimating the characteristics, the number of pieces of data that can be stored, and the like, and is thus not essential.

The model provision unit 104 is configured to provide at least one storage battery model which is based on a fundamental solution of a diffusion equation. This model is hereinafter referred to as "diffusion fundamental solution model."

The model parameter estimation unit 105 is configured to estimate model parameters of the storage battery model based on the time-series data {(p, Vp)|p=0, 1, . . . , m−1} of the terminal voltage V of the storage battery 101 acquired by the time-series data acquisition unit 104 and on the storage battery model provided by the model provision unit 104.

Technical Details of Storage Battery Model

Description is now given of technical details of the storage battery model in the first embodiment.

Figure 3:
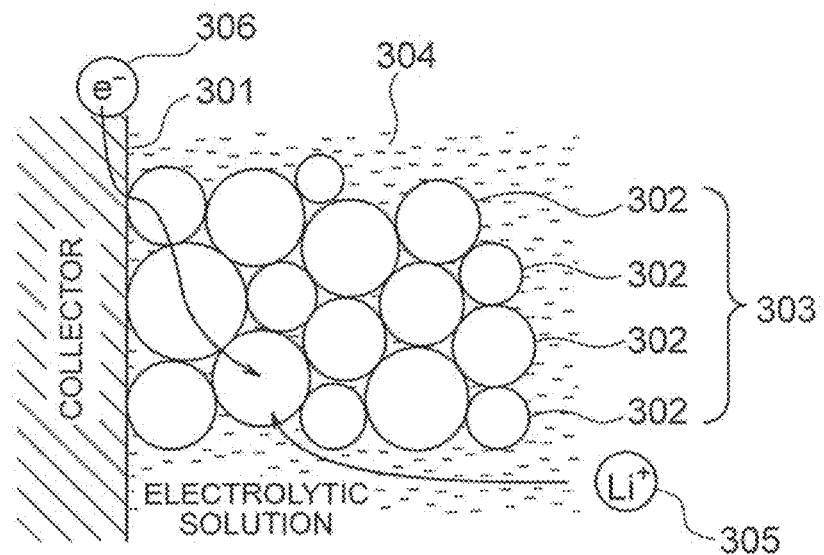
FIG. 3 is an image diagram of an electrode inside the storage battery.

FIG. 3 is an image diagram of an electrode inside the storage battery. A large number of particles 302 are fixed to a collector 301 to form a bulk 303, and the entire bulk 303 is immersed in an electrolytic solution 304. To be exact, conductive assistant for increasing electron conductivity, binder for binding the large number of particles 302, and the like are adhered, but are omitted for the convenience of simplicity.

When the storage battery is charged, a lithium ion 305 is supplied from the electrolytic solution 304 to each of the particles 302, and an electron 306 is supplied from the collector 301 thereto. When the storage battery is discharged, the lithium ion 305 and the electron 306 are released from each particle 302.

As described above, it is assumed that the storage battery is a lithium-ion storage battery in the first embodiment. Thus, FIG. 3 is an image diagram in the case of the lithium-ion storage battery. However, the storage battery may be a lead storage battery, a nickel-hydrogen storage battery, a solid-state battery, a sodium-sulfur battery, a sodium-sulfur battery, a magnesium-ion battery, an electrical double layer, and the like.

For example, when the storage battery is a solid-state battery, the above-mentioned "electrolytic solution" is replaced with "solid electrolyte". Moreover, in the case of the magnesium-ion battery, "lithium ion" is replaced with "magnesium ion".

Figure 4:
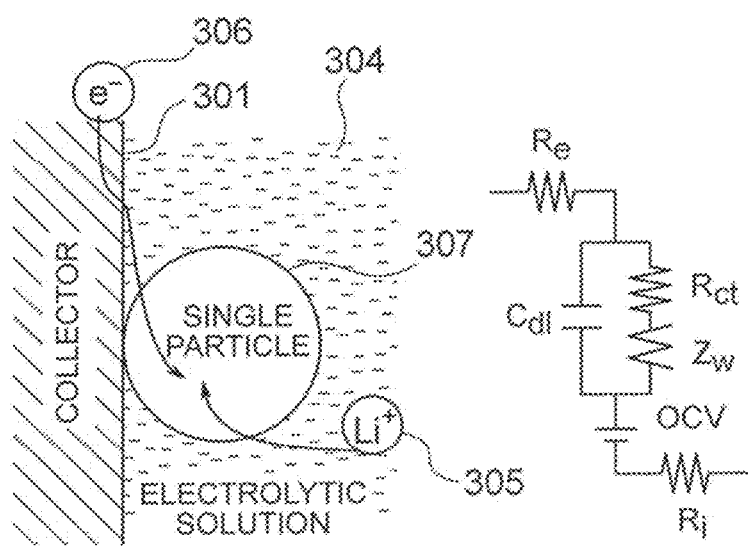
FIG. 4 is a diagram for illustrating an image and an equivalent circuit thereof based on a single particle model of the electrode inside the storage battery.

FIG. 4 is a diagram for illustrating an image and an equivalent circuit thereof of a single particle model of the electrode inside the storage battery. In the equivalent circuit of FIG. 4, Re represents an electron conduction resistance, Rct represents a reaction resistance, Cdl represents an electric double-layer capacitance, Zw represents a diffusion impedance inside the particle 307, OCV represents an open-circuit voltage of the particle 307, and Ri represents an ion conduction resistance.

The single particle model of FIG. 4 can be recognized as an ideal model in which it is assumed that all of the particles 302, the number of which is actually as large as the number illustrated in FIG. 3, exhibit the same behaviors, and the behaviors of all of the particles are summarized to the behavior of the single particle 307. Such a single particle model is widely used as a model of the storage battery, but has a defect in that an uneven lithium ion distribution among particles cannot be expressed.

Figure 5:
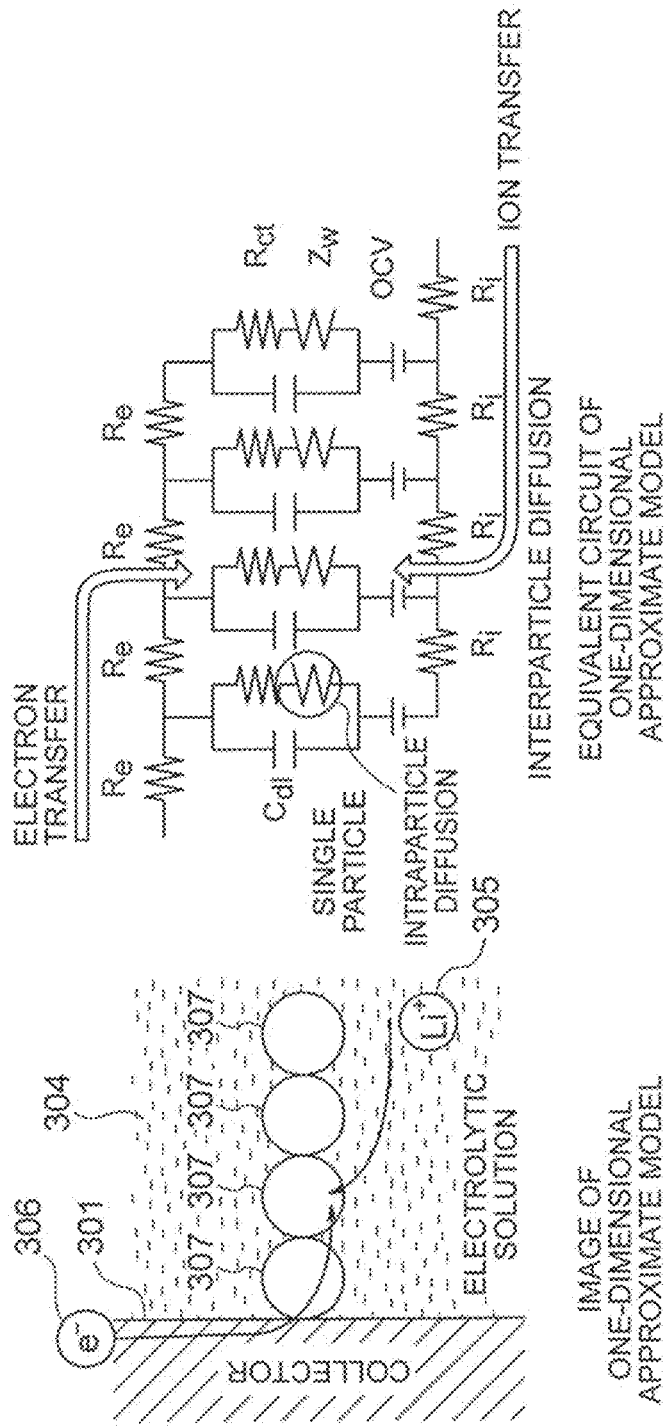
FIG. 5 is a diagram for illustrating an image and an equivalent circuit thereof based on a one-dimensional approximate model of the electrode inside the storage battery.

FIG. 5 is a diagram for illustrating an image and an equivalent circuit thereof of a one-dimensional approximate model of the electrode inside the storage battery. In FIG. 5, there is illustrated a case in which the number of particles is approximately expressed as four for the convenience of description. In this one-dimensional approximate model, it is possible to express the uneven lithium ion distribution among the particles, which is different from the single particle model of FIG. 4.

The equivalent circuit of FIG. 5 is configured such that the equivalent circuits of the single particle model of FIG. are connected in parallel at a plurality of stages. An electron conduction resistance and an ion conduction resistance exist between the particles 307, and thus as the particle 307 becomes closer to the collector 301, the electron conduction resistance decreases and the ion conduction resistance in the electrolytic solution increases. Conversely, as the particle 307 becomes farther from the collector 301, the electron conduction resistance increases and the ion conduction resistance in the electrolytic solution decreases.

Owing to the influence of the electron conduction resistance and the ion conduction resistance, as a current rate increases, differences in ion amount supplied to each particle 307 increase among the particles 307, and unevenness in an SOC distribution occurs among the particles. In a related-art technology for estimating the voltage relaxation process in the stopped state of the storage battery, there has not been built a model applicable to a practical use while reflecting the influence of the uneven SOC distribution among the particles. As a result, it has been difficult to express a voltage relaxation process for a long period reflecting a disappearance process of the uneven SOC distribution among the particles.

In contrast, in the first embodiment, there is used a model that is derived from the one-dimensional approximate model of FIG. 5 and that highly precisely expresses the voltage relaxation process for a long period reflecting the disappearance process of the uneven SOC distribution among the particles.

"Ion" hereinafter refers to an ion that contributes to charge/discharge of the storage battery. For example, the ion is the lithium ion in the case of the lithium-ion battery, the magnesium ion in the case of the magnesium-ion battery, and the sodium ion in the case of the sodium ion battery.

[Approximation Conversion of Equivalent Circuit of One-Dimensional Approximate Model]

Figure 6:
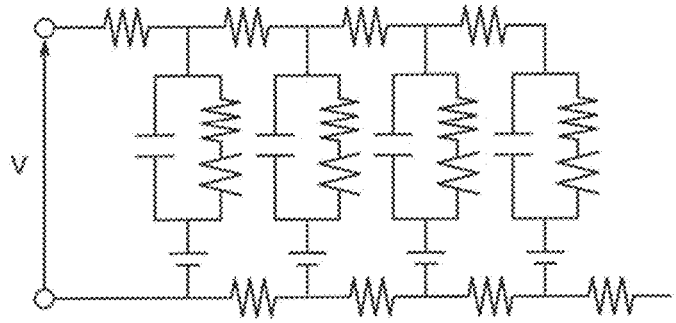
FIG. 6 is a diagram for illustrating an equivalent circuit of a one-dimensional approximation equivalent circuit model.
Figure 7:
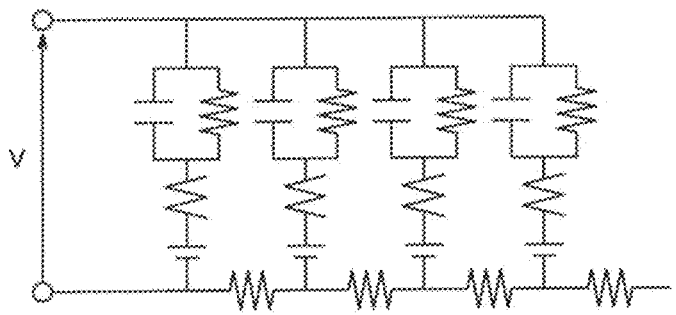
FIG. 7 is a diagram for illustrating an equivalent circuit obtained through approximation conversion of the equivalent circuit of FIG. 6.

First, an equivalent circuit of FIG. 7 is obtained through application of approximate conversion to the equivalent circuit of the one-dimensional approximate model of FIG. 6.

It is assumed that the storage battery is in the stopped state, and several seconds to several hundreds of seconds have elapsed since the stopped state started. Moreover, an electrode electric potential "v" is based on the electric potential of the particles on the collector side.

In the approximate conversion from FIG. 6 to FIG. 7, the electron conduction resistances Re are very small compared with the ion conduction resistance Ri, and are thus neglected. Moreover, Warburg impedances Zw expressing intraparticle diffusion are separated, and are connected in series. A process of the intraparticle diffusion expressed by the Warburg impedance Zw has a long time constant of from about several seconds to about several hundreds of seconds. Meanwhile, a time constant T:=Rct*Cdl of a reaction process based on the reaction resistance Rct and the electric double-layer capacitance Cdl is a short time constant of from about several tens of milliseconds to about several hundreds of milliseconds. As a result, it is generally known that the Warburg impedances Zw can approximately be separated, and can be connected in series.

Figure 8:
FIG. 8 is a diagram for illustrating an equivalent circuit obtained through further approximation conversion of the equivalent circuit of FIG. 7.

After that, an equivalent circuit of FIG. 8 is obtained through further application of approximate conversion to the equivalent circuit of FIG. 7. In the approximate conversion from FIG. 7 to FIG. 8, an overvoltage of each particle in the reaction process is neglected, and the Warburg impedances Zw expressing the intraparticle diffusion are unified. Thus, the equivalent circuit is approximately expressed.

Immediately after the storage battery enters the stopped state, it is considered that the overvoltage of each of the particles varies depending on the past charge/discharge history. However, it is considered that an overvoltage in the reaction process converges to approximately zero after about several tens of milliseconds to about several hundreds of milliseconds in accordance with the time constant in the reaction process.

Moreover, also regarding an overvoltage of the intraparticle diffusion, variation in the overvoltage among the particles decreases when about several seconds to several hundreds of seconds corresponding to the time constant of the intraparticle diffusion elapse and the intraparticle diffusion thus comes close to convergence. As a result, it is considered that a subsequent change in the overvoltage can approximately be expressed by the one Warburg impedance as a representative.

Moreover, regarding the OCV of each particle, it is only required to express a variation of the OCV corresponding to a variation of a particle SOC, and thus it is considered to be sufficient that the OCV is linearly approximated and expressed as a capacitor to be used.

Figure 9:
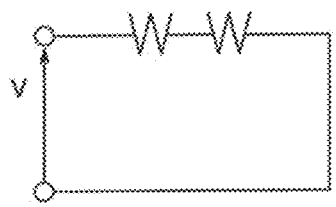
FIG. 9 is a diagram for illustrating an equivalent circuit obtained through still further approximation conversion of the equivalent circuit of FIG. 8.

After that, an equivalent circuit of FIG. 9 is obtained through further application of approximate conversion to the equivalent circuit of FIG. 8. In the equivalent circuit of FIG. 9, a series in a ladder form of the capacitors each expressing the OCV and the ion resistances in the equivalent circuit of FIG. 8 is considered as a distributed constant circuit, and is expressed as a diffusion impedance.

Figure 10:
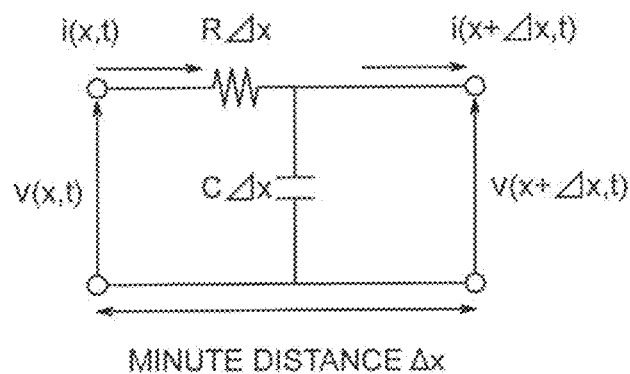
FIG. 10 is a diagram for illustrating derivation of a diffusion equation from a distributed constant circuit in the approximation conversion from FIG. 8 to FIG. 9.

FIG. 10 is a diagram for illustrating derivation of the diffusion equation from the distributed constant circuit in the approximate conversion from FIG. 8 to FIG. 9. FIG. 10 is an illustration of a circuit for expressing a part of a minute distance $\Delta x$ of the distributed constant circuit. The symbols R and C represent a resistance and a capacitance per unit length, respectively. $R\Delta x$ and $C\Delta x$ represent a resistance and a capacitance per the minute distance $\Delta x$, respectively.

First, an equation relating to the current is considered. The following equation is satisfied.

$$i(x + \Delta x, t) - i(x) = -C\Delta x \frac{\partial v}{\partial t}(x + \Delta x, t) \quad (1)$$

When both sides of this equation are divided by $\Delta x$, and $\Delta x$ approaches 0, the following equation is satisfied.

$$\frac{\partial i}{\partial x}(x, t) = -C \frac{\partial v}{\partial t}(x, t) \quad (2)$$

Similarly, an equation relating to the voltage is considered. The following equation is satisfied.

$$v(x,t) - v(x+\Delta x, t) = R\Delta x \cdot i(x,t) \quad (3)$$

When both sides of this equation are divided by $\Delta x$, and $\Delta x$ approaches 0, the following equation is satisfied.

$$\frac{\partial v}{\partial x}(x, t) = -R i(x, t) \quad (4)$$

When both sides are further partially differentiated with respect to "x", the following equation is obtained.

$$\frac{\partial^2 v}{\partial x^2}(x, t) = -R \frac{\partial i}{\partial x}(x, t) \quad (5)$$

Finally, when "$\partial i(x, t)/\partial x$" is removed from Expression (2) and Expression (5), and "1/RC" is replaced with "D", the following equation is obtained.

$$\frac{\partial v}{\partial t}(x, t) = D \frac{\partial^2 v}{\partial x^2}(x, t) \quad (6)$$

This equation is nothing but a diffusion equation.

As described above, as the electrode electric potential model in the stopped state of the storage battery, there is obtained the model in which the diffusion impedances are connected in series as illustrated in FIG. 9. The particle in the intraparticle diffusion is ideally spherical, and the intraparticle diffusion thus follows a three-dimensional diffusion. The interparticle diffusion is diffusion in a direction of the depth "x", that is, a direction from the collector to a separator, and thus follows a one-dimensional diffusion.

[Derivation of Mathematical Models of Voltage Relaxation Process]

Mathematical models of the voltage relaxation process are now derived from the above-mentioned equivalent circuit model.

First, in a region of "$-\infty < x < +\infty$", an initial distribution is set such that "$v(x, 0) = v_0(x)$", and a boundary condition is set such that "$v(\pm\infty, t) = 0$". When an actual diffusion of the lithium ion is considered, the region of the position "x" of the lithium ion is "$0 \le x < +\infty$". However, when a region "$-\infty < x \le 0$" is virtually considered so as to be symmetrical in the left and right direction with the region "$0 \le x < +\infty$", the concentration gradient is always 0 at the origin. As a result, the inflow and the outflow of the lithium ion do not occur at the origin as a boundary from the macroscopic perspective, and thus discussion in the case in which the condition of the region is "$-\infty < x < +\infty$" can similarly be applied.

Moreover, the region of the position "x" of the lithium ion is expected to be limited by a certain value $x_{max}$ to a finite region "$0 \leq x \leq x_{max}$" in a strict sense. However, in general, when a diffusion layer is very thick, the region is often considered as the semi-infinite region "$0 \leq x < +\infty$". Thus, the first embodiment also follows this assumption. Under this assumption, the solution of the diffusion equation given by Expression (6) is expressed as follows.

$$v(x, t) = \frac{1}{\sqrt{4\pi Dt}} \int_{-\infty}^{\infty} v_0(x') \exp\left(-\frac{(x-x')^2}{4Dt}\right) dx' \tag{7}$$

However, it is difficult to obtain the analytical solution of Expression (7), and the solution is obtained only in a limited case having a special initial distribution.

Thus, there is considered a case in which the initial distribution $v_0(x)$ is $\delta(x)$. The symbol $\delta(x)$ represents a delta function, and is defined as follows.

$$\delta(x) := \begin{cases} \infty & x = 0 \\ 0 & x \neq \end{cases} \tag{8}$$

The case in which the initial distribution follows the delta function can be considered as a state in which a substance having a concentration of 1 is dropped at x=0. In this case, the solution of the diffusion equation is given as follows.

$$v(x, t) = \frac{1}{\sqrt{4\pi Dt}} \int_{-\infty}^{\infty} \delta(x') \exp\left(-\frac{(x-x')^2}{4Dt}\right) dx' = \tag{9}$$

$$\frac{1}{\sqrt{4\pi Dt}} \exp\left(-\frac{x^2}{4Dt}\right) =: G(x, t)$$

G(x, t) is also referred to as "Green function", and is known as a fundamental solution of the diffusion equation.

When this is generalized, a term based on the fundamental solution of the one-dimensional diffusion equation is given as follows through use of a parameter "k" and a function "f".

$$\eta(t) = \frac{k}{\sqrt{t}} f(t) \tag{10}$$

The symbol "k" represents a parameter for adjusting the magnitude.

In the first embodiment, the electrode electric potential or the initial distribution of the lithium ion concentration is assumed to be the distribution of the fundamental solution exhibited after a certain period of "z" seconds elapses. That is, an estimated value of "v" expressed by "v" with the hat is defined as follows.

$$\hat{v}(x, t) = kG(x, t+z) = \frac{k}{\sqrt{4\pi D(t+z)}} \exp\left(-\frac{x^2}{4D(t+z)}\right) \tag{11}$$

The symbol "k" represents the parameter for adjusting the magnitude, and the symbol "z" represents a time shift parameter.

When this is generalized, a term based on the fundamental solution of the one-dimensional diffusion equation further including the time shift parameter is given as below.

$$\eta(t) = \frac{k}{\sqrt{t+z}} f(t) \tag{12}$$

Description is now given of validity of the employment of Expression (11) and Expression (12) to which the time shift parameter is introduced, and principle thereof.

First, consideration is given to finding such functions $f_{min}$ and $f_{max}$ that the electric potential distribution v(x, t) inside the electrode satisfies the following inequality at any time satisfying "t>0" when the storage battery is charged.

$$f_{min}(x,t) \leq v(x,t) \leq f_{max}(x,t), 0 \leq \forall x < \infty \tag{13}$$

An initial distribution of the function $f_{max}$ is represented by $f_{0,max}$. A difference between $f_{max}$ and "v" is specifically calculated as follows.

$$f_{max}(x, t) - v(x, t) = \tag{14}$$

$$\int_{-\infty}^{\infty} f_{0,max}(x') G(x-x', t) dx' - \int_{-\infty}^{\infty} v_0(x') G(x-x', t) dx' =$$

$$\int_{-\infty}^{\infty} (f_{0,max}(x') - v_0(x')) G(x-x', t) dx'$$

In order to satisfy the relationship "$f_{max}(x, t) \geq v(x, t)$", it is only required to find such $f_{0,max}(x)$ satisfying "$f_{0,max}(x) \geq v_0(x)$".

In consideration of such a fact that $v_0$ is finite, that is, $v_0 \leq v_{max}$, and $v_0(\infty)=0$, $f_{0,max}(x)$ is set as follows, and it is possible to select M and $t_M$ so that "$f_{0,max}(x) \geq v_0(x)$" is satisfied.

$$f_{0,max}(x) = MG(x, t_M) \tag{15}$$

Moreover, similarly, for $f_{min}$, $f_{0,min}(x)$ is set as follows, and it is possible to select "m" and $t_m$ so that "$f_{0,min}(x) \leq v_0(x)$" is satisfied.

$$f_{0,min}(x) = mG(x, t_m) \tag{16}$$

In this case, Expression (13) is given as follows.

$$mG(x, t+t_m) \leq v(x,t) \leq MG(x, t+T_M), t>0, 0 \leq x < \infty \tag{17}$$

Expression (17) means that the electric potential distribution of the electrode has a shape that gradually decreases from an electrode interface toward a deep portion even when the electric potential distribution of the electrode fluctuates depending on a past charge current.

Further, when consideration is given to a state in which "$t \gg t_M, t_m$" is satisfied at the electrode interface, that is x=0, the following relationship is satisfied.

$$MG(0, t+t_M) - mG(0, t+t_m) = \tag{18}$$

$$\frac{M}{\sqrt{4\pi(t+t_M)}} - \frac{m}{\sqrt{4\pi(t+t_m)}} \approx \frac{M-m}{\sqrt{4\pi t}} =: \varepsilon$$

An error $\varepsilon$ decreases as the time elapses, and $\varepsilon$ approaches 0 when "t" approaches $\infty$. That is, MG(0, t+$t_M$), mG(0, t+$t_m$), and v(x, t) therebetween converge to the same value as the time elapses, and differences among those values decrease, which is natural because the relaxation behavior of the electric potential is observed.

Thus, consideration is given to a set of fundamental solution models that exist between the two fundamental solution models of Expression (17), and when a model that best matches an actual electric potential behavior can be selected, it is possible to estimate a future electric potential behavior from an electric potential behavior detected in the past.

Figure 11:
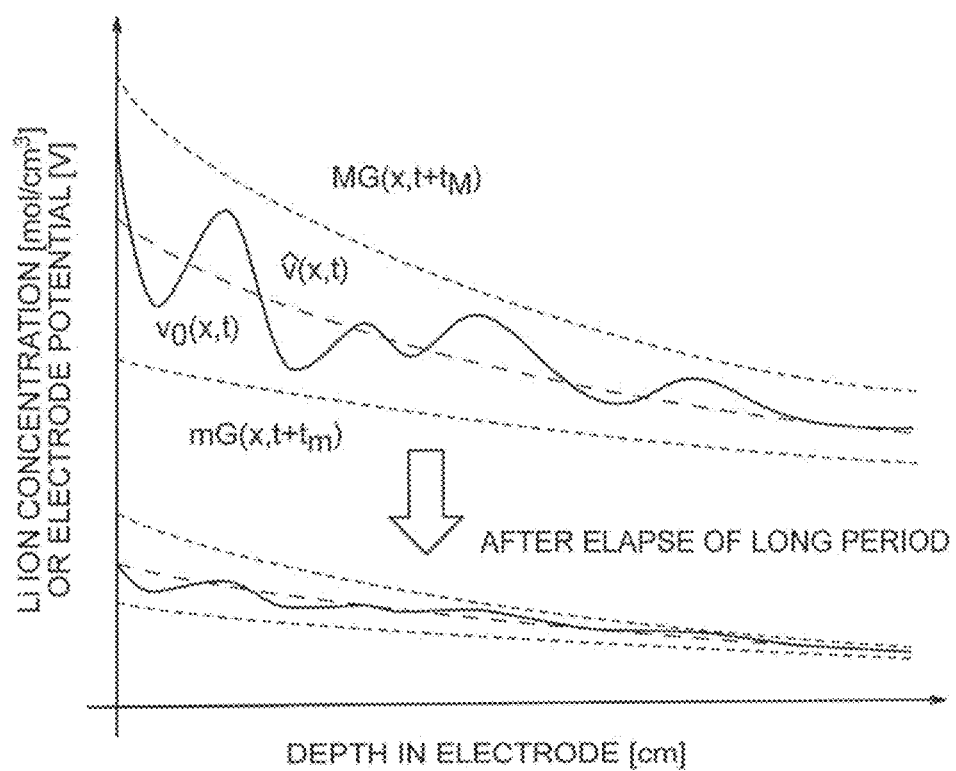
FIG. 11 is an image diagram of an electric potential distribution in a voltage relaxation process.

FIG. 11 is an image diagram of the electric potential distribution in the voltage relaxation process. The solid lines indicate an actual electric potential distribution. The upper dotted lines indicate an upper limit fundamental solution model. The lower dotted lines indicate a lower limit fundamental solution model. The broken lines therebetween indicate an estimated fundamental solution model.

Both of the actual electric potential distribution and the estimated fundamental solution model are fit between the upper limit fundamental solution model and the lower limit fundamental solution model at all positions in the depth "z" direction, and the positional relationship among the models does not change even after a long period elapses. It can be understood that, while the upper limit fundamental solution model and the lower limit fundamental solution model have relatively large errors from the actual distribution, the estimated fundamental solution model appropriately reflects a low frequency behavior of the actual distribution.

The lithium ion concentration depends on the past charge/discharge history and the like, and high concentrations and low concentrations locally exist. However, as a macroscopic tendency, it is expected that the concentration is high at the electrode interface, and the concentration decreases or, conversely, increases as the depth increases.

The fundamental solution model in the first embodiment is a model that reflects such a global behavior. The local highs and lows of the electric potential, that is, the highs and lows of the ion concentration disappear as the diffusion phenomenon progresses. It is thus considered that, as the actually measured data is acquired after a longer period, the actual data is less influenced by the initial distribution, and the precision of the model increases.

As interpretation from another viewpoint of the estimated fundamental solution model of Expression (11), it can be considered that the ion concentration inside the electrode is approximately expressed as a distribution of diffusion of ions that had a high concentration and was brought to the electrode interface "z" seconds before. That is, it is possible to highly precisely grasp the most dominant and low frequency diffusion process that remains after the local highs and lows of the concentration of the ion distribution corresponding to the past charge/discharge history disappear as the time elapses through the fundamental solution having the magnitude and the position appropriately adjusted and shifted through use of the parameters "k" and "z", respectively.

In the same manner as in the discussion given above, a mathematical model is derived also for the diffusion inside the electrode particle. The electrode particle is ideally spherical, and thus it is considered that the diffusion inside the particle follows a three-dimensional diffusion. Consideration is now given to a case of three-dimensional spherical symmetry. A diffusion equation in this case is given below.

$$\frac{\partial v_p}{\partial t}(r, t) = D_p \frac{1}{r^2} \frac{\partial}{\partial r}\left(r^2 \frac{\partial v_p}{\partial r}(r, t)\right) \quad (19)$$

The symbol "r" represents a position in the spherical coordinates. A fundamental solution corresponding thereto is given below.

$$v_p(r, t) = \frac{1}{(4\pi D_p t)^{3/2}} \exp\left(-\frac{r^2}{4D_p t}\right) \quad (20)$$

When this is generalized, a term based on the fundamental solution of the three-dimensional diffusion equation is given as follows through use of a parameter "k" and a function "f".

$$\eta(t) = \frac{k}{t^{3/2}} f(t) \quad (21)$$

As in the case of the one-dimensional diffusion equation, when an initial distribution follows the fundamental solution after $z_p$ seconds, the electric potential on the particle surface $r=r_d$ is given as below.

$$v_p(r_d, t) = \frac{k_p}{(4\pi D_p(t+z_p))^{3/2}} \exp\left(-\frac{r_d^2}{4D_p(t+z_p)}\right) \quad (22)$$

This is generalized as below.

$$\eta(t) = \frac{k}{(t+z)^{3/2}} f(t) \quad (23)$$

[Application to Storage Battery]

Figure 12:
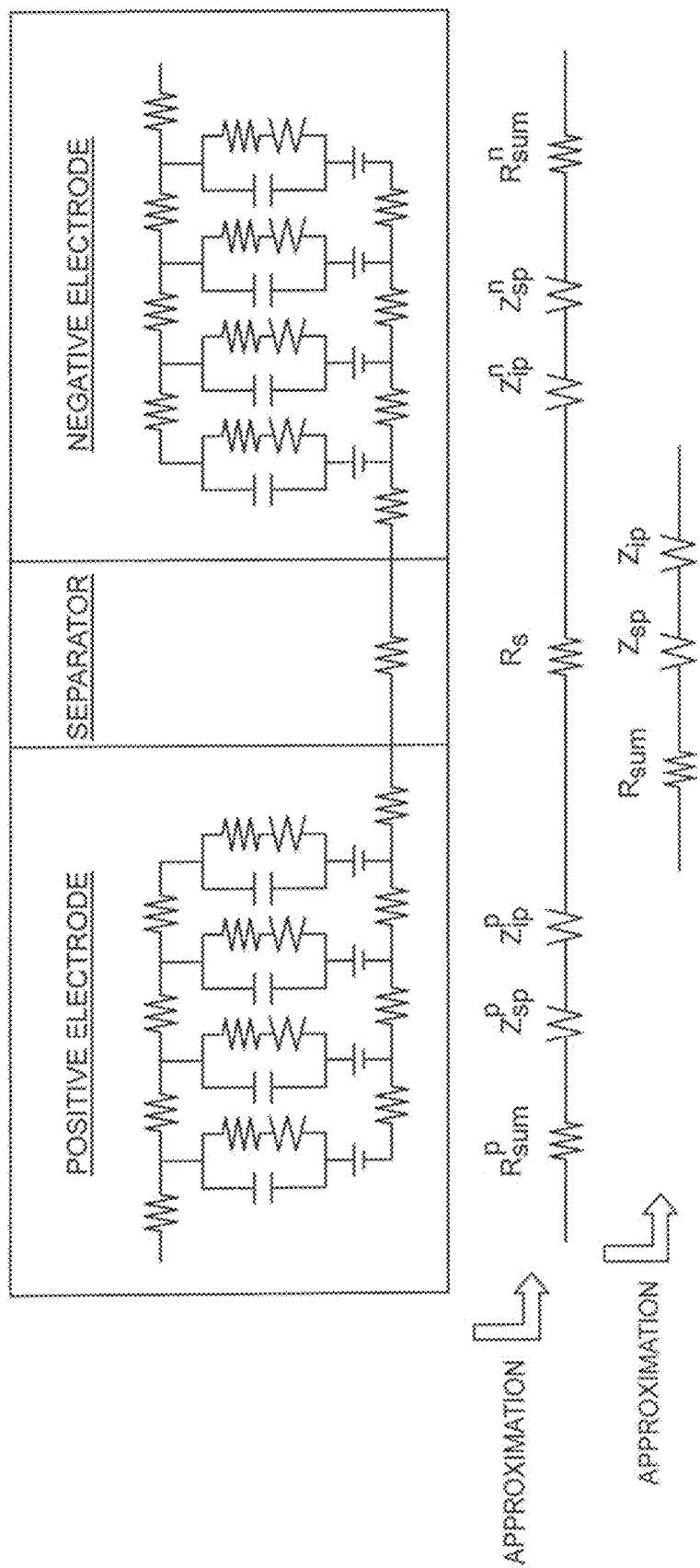
FIG. 12 is a diagram for illustrating a one-dimensional equivalent circuit inside a storage battery including a positive electrode and a negative electrode.

FIG. 12 is a diagram for illustrating a one-dimensional equivalent circuit inside a storage battery including a positive electrode and a negative electrode. The above description is given of the behavior of only one of the positive electrode or the negative electrode. However, in FIG. 12, the one-dimensional equivalent circuits of both of the positive electrode and the negative electrode are connected through intermediation of the separator.

When a voltage relaxation model is built from the equivalent circuit of FIG. 12, an example thereof is given below.

$$\hat{V}(t) = \frac{k_1^p}{(t+z_1^p)^{3/2}} \exp\left(-\frac{w_p}{t+z_1^p}\right) + \quad (24)$$

$$\frac{k_1^n}{(t+z_1^n)^{3/2}} \exp\left(-\frac{w^n}{t+z_1^n}\right) + \frac{k_2^p}{(t+z_2^p)^{1/2}} + \frac{k_2^n}{(t+z_2^n)^{1/2}} + OCV$$

Right upper suffixes of "p" and "n" indicate a parameter of the positive electrode and a parameter of the negative electrode, respectively.

It is not required to directly use Expression (24), and a part of terms and a part of parameters may be omitted.

For example, parts corresponding to exponential functions rapidly attenuate as the time "t" elapses, and We may thus be set to 0, that is, the parts corresponding to exponential functions may be set to 1. The right upper suffix "e" represents "p" or "n".

Further, the terms of the positive electrode and the negative electrode may be unified. The intraparticle diffusion generally has a time constant on the order of several seconds to several hundreds of seconds, and the following approximation expression is thus established depending on conditions.

$$\frac{k_1}{(t+z_1)^{3/2}} + \frac{k_2}{(t+z_2)^{3/2}} \approx \begin{cases} \frac{k_1+k_2}{(t+z_i)^{3/2}}, z_1 \approx z_2 \text{ or } z_i \gg z_j \\ \frac{k_1+k_2}{t^{3/2}}, t \gg z_1, z_2 \end{cases} \quad (25)$$

In this expression, a first condition on the right side means that the diffusion time constants of the positive electrode and the negative electrode are values close to each other, or the time constant of one of the electrodes is very large compared with the time constant of the other electrode. Moreover, a second condition on the right side indicates that the time "t" used for the estimation is sufficiently larger than $z_1$ and $z_2$.

Further, as a third condition, when the time "t" is even larger, it is possible to approximate the intraparticle diffusion itself as zero, which is not clearly indicated in Expression (24).

Meanwhile, the interparticle diffusion has a smaller $k_i$ than that of the intraparticle diffusion, and thus the following approximation expression is satisfied.

$$\frac{k_1}{(t+z_1)^{1/2}} + \frac{k_2}{(t+z_2)^{1/2}} \approx \begin{cases} \frac{k_i+k_j}{(t+z_i)^{1/2}}, z_1 \approx z_2 \text{ or } k_i \gg k_j \\ \frac{k_i}{(t+z_i)^{1/2}} + \frac{k_j}{t^{1/2}}, t \gg z_j \end{cases} \quad (26)$$

There is a relationship of i≠j. In this expression, a first condition on the right side means that the time constants of the interparticle diffusion of the positive electrode and the negative electrode are values close to each other, or the overvoltage of one of the electrodes is very large compared with the overvoltage of the other electrode. Moreover, a second condition on the right side means that the time "t" used for the estimation is sufficiently larger than the time constant of the interparticle diffusion of the one electrode.

As described above, the model can be simplified into various forms based on the characteristics of the positive electrode and the negative electrode, a data range of the fitting, and the like.

Essence of the model in the first embodiment resides in that, while the interparticle diffusion has hitherto not been considered, or it has hitherto been difficult to build a model of the interparticle diffusion that can practically be used, the voltage relaxation process including the interparticle diffusion is expressed by the model which is based on the fundamental solution of the diffusion equation, and the time shift parameter "z" is introduced into the fundamental solution model. This essence described by a more general model equation is given below.

$$\hat{V}(t) = f(t) + \frac{k_2}{(t+z_2)^{1/2}} \cdot g(t) + OCV \quad (27)$$

A function f(t) in the expression is a function that expresses an overvoltage caused by a DC resistance, a reaction resistance, an intraparticle diffusion resistance, and the like in a relatively short period. As this function, there may be used a function that is generally used and assumes an equivalent circuit formed of a DC resistance element and one or more CR parallel elements.

Meanwhile, a function g(t) is a function that corrects a diffusion fundamental solution term for expressing the interparticle diffusion, and is used to appropriately describe an electric potential fluctuation observed when the time "t" is relatively small, which is caused by, for example, the local highs and lows of the potential distribution inside the electrode which is based on the past charge/discharge history.

As an example of the function f(t) of Expression (27), there may be used a term based on a general battery equivalent circuit, for example, a term based on a DC resistance and CR parallel elements connected in series at a plurality of stages. That is, the function f(t) is given as below.

$$f(t) = RI + \sum_{i=1}^{n_{CR}} k_i e^{-\frac{t}{\tau_i}} \quad (28)$$

In this case, the function f(t) includes, as parameters of the equivalent circuit, a part of or all of R, $k_i$, and $\tau_i$ (i=1, 2, . . . , $n_{CR}$) in estimated parameters.

In consideration of a purpose of the function g(t), it is desired that the function g(t) converge to 1 in a relatively short period, specifically, from about several seconds to about several hundreds of seconds, and thus lose contribution to the diffusion fundamental solution. Various forms of the function g(t) are conceivable, and an example thereof is given below.

$$g(t) = \exp\left(-\frac{w}{t+z}\right) \quad (29)$$

Moreover, another example is given below.

$$g(t) = 1 - \exp\left(-\frac{t}{\tau}\right) \quad (30)$$

The function g(t) is usually used to correct the interparticle diffusion term as described above, but may serve in place of the function f(t).

Alternatively, there is clearly shown below the model in which the intraparticle diffusion is expressed by the fundamental solution of the three-dimensional diffusion equation, which is another piece of important essence of the first embodiment.

$$\hat{V}(t) = \frac{k_1}{(t+z_1)^{3/2}} f(t) + \frac{k_2}{(t+z_2)^{1/2}} \cdot g(t) + OCV \quad (31)$$

The model provision unit 104 provides at least one of models that are built as described above and are based on the fundamental solution of the diffusion equation. The diffusion fundamental solution model may be stored inside the model provision unit 104, or may be stored outside the model provision unit 104, for example, on a cloud.

The model provision unit 104 selects, from a set of diffusion fundamental solution models that can be provided by the model provision unit 104, a model that has not been output yet each time a control signal for instructing the model provision unit 104 to change the model is received from the model parameter estimation unit 105 described below, and outputs the selected model to the model parameter estimation unit 105.

Moreover, when the model provision unit 104 has output all of the models, and there does not thus exist a model that has not been output, the model provision unit 104 transmits, to the model parameter estimation unit 105, a control signal for instructing the model parameter estimation unit 105 to finish the model parameter estimation.

[Estimation of Model Parameters]

As described above, the model parameter estimation unit 105 estimates the model parameters of the diffusion fundamental solution model of the storage battery 101 based on the time-series data $\{(p, Vp)|p=0, 1, \ldots, m-1\}$ of the terminal voltage V of the storage battery 101 acquired by the time-series data acquisition unit 103 and the diffusion fundamental solution model provided by the model provision unit 104.

Figure 13:
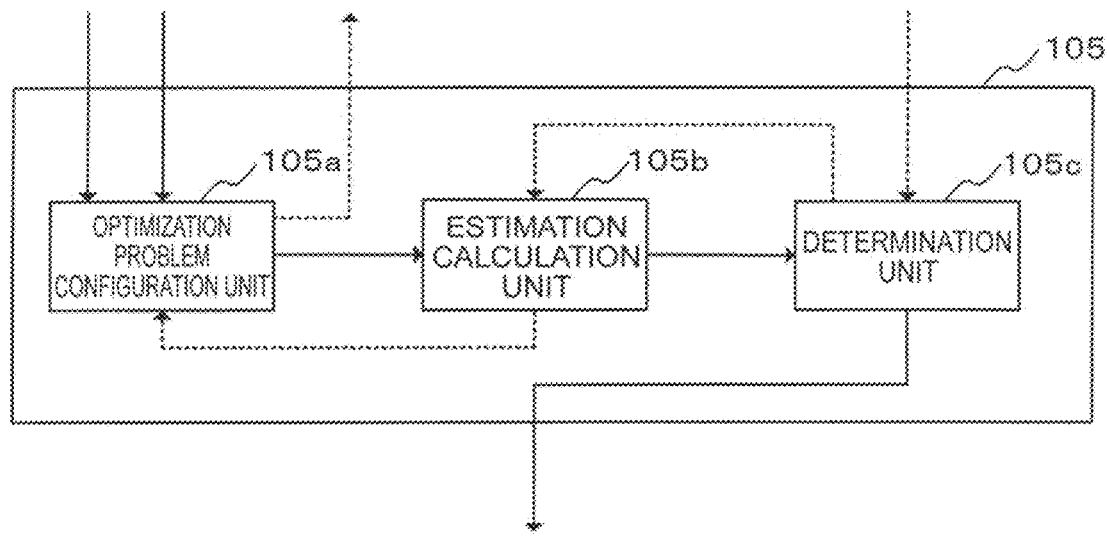
FIG. 13 is a block diagram for illustrating an internal configuration of a model parameter estimation unit included in the characteristic estimation device of FIG. 1.

FIG. 13 is a diagram for illustrating an internal configuration of the model parameter estimation unit 105. The model parameter estimation unit 105 includes an optimization problem configuration unit 105a, an estimation calculation unit 105b, and a determination unit 105c.

The optimization problem configuration unit 105a configures an optimization problem to be solved. In detail, the optimization problem configuration unit 105a configures an optimization problem based on the time-series data $\{(p, Vp)|p=0, 1, \ldots, m-1\}$ acquired by the time-series data acquisition unit 103, the diffusion fundamental solution model provided by the model provision unit 104, and a control signal for instructing the optimization problem configuration unit 105a to change the configuration of the optimization problem from the estimation calculation unit 105b, and outputs an evaluation function L and constraint inequalities.

The evaluation function L is most typically formed of summation of square errors as described below.

$$L(\theta) = \sum_{p=0}^{m-1} \left(\hat{V}(\theta, p) - V(p)\right)^2 \tag{32}$$

The symbol $\theta$ represents a vector formed by vertically arranging the model parameters to be estimated. Consideration is given to, for example, a case in which the following diffusion fundamental solution model is used.

$$\hat{V}(t) = \frac{k_1}{(t+z_1)^{3/2}} + \frac{k_2}{(t+z_2)^{1/2}} + OCV \tag{33}$$

In this case, $\theta$ is given as below.

$$\theta = [k_1 \; k_2 \; z_1 \; z_2 \; OCV]^T \tag{34}$$

Moreover, the constraint inequalities are expressed as below.

$$h_i(x) \leq 0, i=1, \ldots, n_h \tag{35}$$

For example, when it is known that $k_1$ and $k_2$ of Expression (34) are not negative, and the OCV is equal to or higher than $V_{min}$ and is equal to or lower than $V_{max}$, it is only required to configure the constraint inequalities as below.

$$-k_1 \leq 0$$

$$-k_2 \leq 0$$

$$V_{min} - OCV \leq 0$$

$$OCV - V_{max} \leq 0 \tag{36}$$

The following optimization problem is configured as described above.

$$\min_{\theta} L(\theta) \text{ s.t. } h_i(\theta) \leq 0, i = 1, \ldots, n_h \tag{37}$$

Note that, the constraint inequalities are not essential, and there may be configured an optimization problem without constraint.

When the optimization problem configuration unit 105a receives a control signal for instructing the optimization problem configuration unit 105a to change the configuration of the optimization problem from the estimation calculation unit 105b, the optimization problem configuration unit 105a changes the configuration of the optimization problem to a configuration different from a previous configuration. Specifically, the optimization problem configuration unit 105a executes an operation of changing the evaluation function, an operation of adding a constraint inequality, and the like.

Moreover, when the optimization problem configuration unit 105 receives the control signal from the estimation calculation unit 105b, but there does not exist a candidate having a configuration different from the past configurations, the optimization problem configuration unit 105a transmits, to the model provision unit 104, a control signal for instructing the model provision unit 104 to change the model.

The estimation calculation unit 105b uses a certain optimization method to execute the estimation calculation based on the evaluation function L and the constraint inequalities $h_i \leq (i=1, \ldots, n_h)$ output from the optimization problem configuration unit 105a, to thereby obtain the optimal solution of the optimization problem, and outputs the estimated model parameter $\theta$ and the value of the evaluation function L.

For example, when the optimization problem does not include the constraint inequalities, it is possible to use the gradient descent method, the Newton's method, the Gauss-Newton method, the Quasi-Newton method, the Levenberg-Marguardt method, and the like.

Moreover, when the optimization method includes the constraint inequalities, it is possible to use the penalty function method, the multiplier method, the sequential quadratic programming method, the interior point method, the generalized reduced gradient (GRG) method, and the like.

As the optimization method, it is only required to selectively use an appropriate method based on the scale of the problem, the number of variables, natures, calculation resources, and the like. Moreover, the optimization method is not limited to the above-mentioned methods, and there may be used another publicly-known optimization method.

As another example, in a case in which when specific model parameters are fixed to certain values, the model becomes linear with respect to the other model parameters, the following operation may be repeated. The specific model parameter values are fixed, and the linear least squares method is applied to the other model parameters to obtain the values of the other model parameters. Then, the specific model parameter values are changed, and the linear least squares method is applied to the other model parameters to obtain the values of the other model parameters again. In this manner, there may be obtained a combination of the values of the specific model parameters and the other model parameters which minimize the evaluation function.

When the estimation calculation unit 105b receives, from the determination unit 105c, a control signal for instructing the estimation calculation unit 105b to perform again the estimation calculation, the estimation calculation unit 105b changes the settings, and performs the estimation calculation again. This means changes in initial values, a change in the estimation method, and the like. However, when, for example, there is no possibility of the performing again of the estimation calculation, or the number of times of the performing again of the estimation calculation exceeds a set value, the estimation calculation unit 105b transmits, to the optimization problem configuration unit 105a, a control signal for instructing the optimization problem configuration unit 105a to change the optimization problem.

The determination unit 105c outputs a control signal or the estimation model parameter θ based on the value of the evaluation function L and the estimation model parameter θ output from the estimation calculation unit 105b and on the control signal from the model provision unit 106.

When the value of the evaluation function L output from the estimation calculation unit 105b is equal to or smaller than a set value, the determination unit 107c determines that the estimation of the model parameter θ is successful, and outputs the estimated model parameter θ.

Conversely, when the value of the evaluation function L is larger than the set value, the determination unit 105c transmits, to the estimation calculation unit 105b, a control signal for instructing the estimation calculation unit 105b to perform again the model parameter estimation. In this case, the estimation calculation unit 105b stores an estimated model parameter θ corresponding to a smaller one of the current value and a past value of the evaluation function L.

When the determination unit 105c receives, from the model provision unit 104, a control signal for instructing the model parameter estimation unit 105 to finish the model parameter estimation, the determination unit 105c finishes the processing performed by the model parameter estimation unit 105, and outputs the stored estimated model parameter θ.

As described above, the characteristic estimation device for a storage battery according to the first embodiment includes: the voltage detection unit configured to detect the terminal voltage of the storage battery; the time-series data acquisition unit configured to acquire the time-series data on the terminal voltage in the stopped state of the storage battery; the model provision unit configured to provide the storage battery model; and the model parameter estimation unit configured to estimate the model parameter of the storage battery model based on the time-series data on the terminal voltage acquired by the time-series data acquisition unit and on the storage battery model provided by the model provision unit. The storage battery model includes the OCV term for expressing the OCV of the storage battery and the interparticle diffusion term which is based on the fundamental solution of the one-dimensional diffusion equation expressing the ion diffusion among particles forming the electrodes of the storage battery. With this configuration, it is possible to highly precisely estimate the voltage relaxation process in the stopped state of the storage battery.

[Estimation Results of Model Parameters]

Description is now given of results of the estimation of the model parameters from the time-series data on actual storage batteries through use of Expression (24) as the diffusion fundamental solution model. The estimated model parameters are the four parameters including $k_1$, $k_2$, $z_2$, and the OCV. The GRG method was used as the estimation method.

Figure 14:
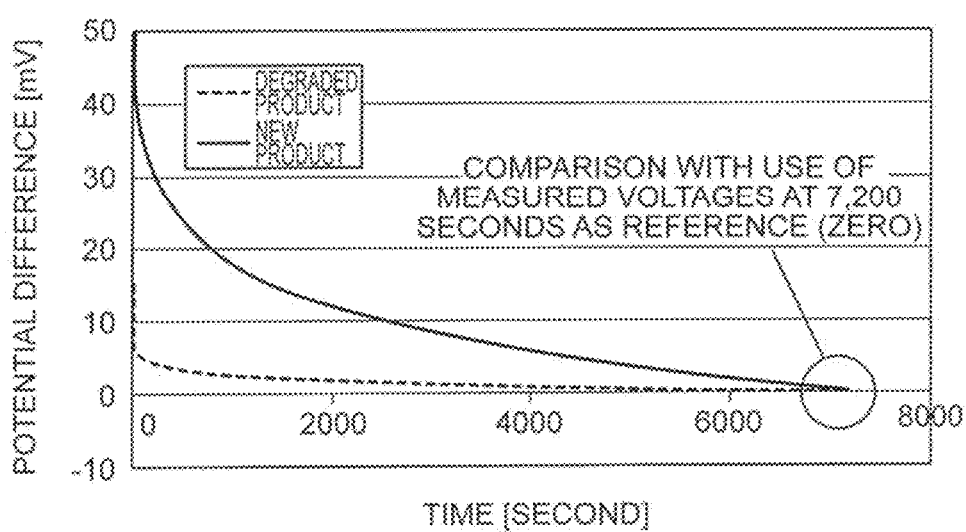
FIG. 14 is a graph for showing electric potential relaxation curves of half cells.

In FIG. 14, there are shown electric potential relaxation curves of half cells produced by disassembling lithium-ion storage batteries and using positive electrode materials. A smaller electric potential change corresponds to an electric potential change in a new product. A larger electric potential change corresponds to an electric potential change in a degraded product. Moreover, the electric potential change is plotted such that the electric potentials thereof at a time of 7,200 seconds are set to zero for comparison.

It is apparent that the degraded product has a larger electric potential change, and the electric potential has not converged even at the time of 7,200 seconds. Thus, a degraded storage battery generally has a very long period required for the relaxation of the electrode electric potential. As a result, it is important to predict the voltage relaxation process in order to obtain highly precise SOC-OCV data.

Figure 15:
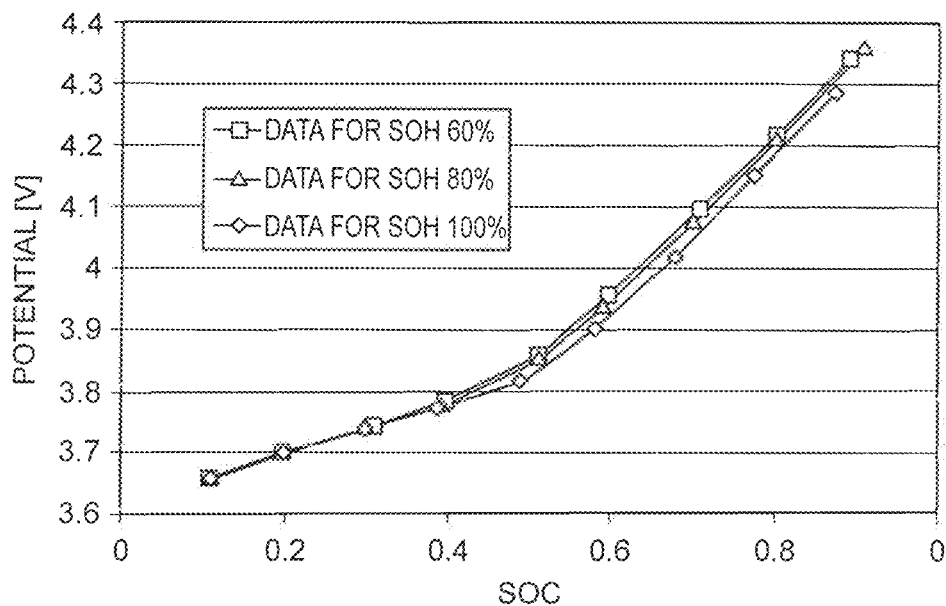
FIG. 15 is a graph for showing three types of SOC-OCP data acquired in half cells.

In FIG. 15, there are shown three types of SOC-OCP data acquired in produced half cells. The three types of data correspond to about 100%, about 80%, and about 60% of the SOH, respectively. In general, it is said that the shape of the SOC-OCP curve does not change even after the degradation. However, the data corresponding to 80% and 60% of the SOH of FIG. 15 present slightly higher electric potentials in a high SOC region compared with the data on a new product corresponding to 100% of the SOH. As the cause for this phenomenon, there can be conceived such a possibility that the electric potential relaxation had not sufficiently converged.

Figure 16:
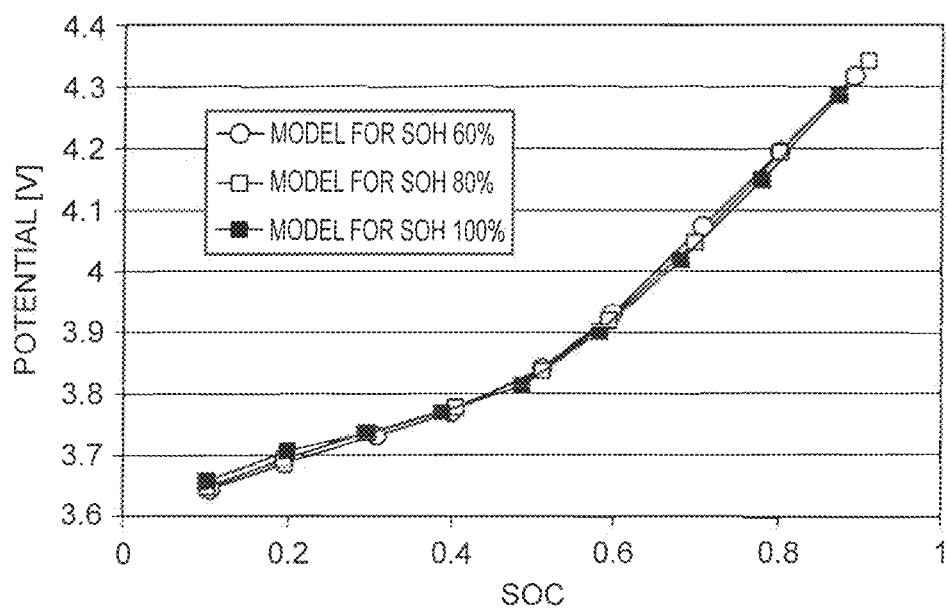
FIG. 16 is a graph for showing results of estimation of the OCP through application of a method according to the first embodiment of the present invention to all of the types of data of FIG. 15.

FIG. 16 is a graph for showing results of estimation of the OCP through application of the method according to the first embodiment to all of the data of FIG. 15. The tendency that the degraded products present the higher electric potential in the high SOC region substantially completely disappears, and the shape of the curve match that of the new product over the entire section. That is, it is highly likely that a true OCP can be estimated highly precisely.

SUMMARY

Advantages of the model of the voltage relaxation process in the first embodiment can be summarized below.

As the first idea, there is used the model reflecting the interparticle diffusion, which is a physical phenomenon that has not hitherto been considered. As a result, the long voltage relaxation process that takes several hours to several tens of hours or more can be formed into the highly precise model having the physical basis.

As the second idea, the idea of using the term based on the fundamental solution of the diffusion equation enables the building of the model that simultaneously achieves the small number of model parameters and the high precision, and the theoretical basis thereof is also described.

As the third idea, in order to use the term based on the fundamental solution of the above-mentioned diffusion equation, the fundamental solution of the general diffusion equation is not directly used, but the time shift parameter is introduced. As a result, the highly precise modeling is enabled, and the theoretical basis thereof is also described.

As the fourth idea, when there is built the model including the term of the intraparticle diffusion as in the general battery model in addition to the above-mentioned term of the interparticle diffusion, the term of the intraparticle diffusion is expressed by the term based on the fundamental solution of the three-dimensional diffusion equation. As a result, the highly precise modeling with the smaller number of model parameters is enabled, and the theoretical basis thereof is also described. The intraparticle diffusion and the interparticle diffusion exist in a mixed manner in the voltage relaxation process, and hence the voltage relaxation cannot always be highly precisely modeled and predicted through use of only the interparticle diffusion term based on the above-mentioned first to third ideas. That is, in order to highly precisely fit the interparticle diffusion, it is also important to highly precisely model and fit the intraparticle diffusion. Thus, the fourth idea is also important for highly precisely fitting the model parameters of the term for expressing the long voltage relaxation process based on the first to third ideas, and is an idea for enhancing the effects of the first to third ideas.

As the fifth idea, the interparticle diffusion model in the first embodiment enables the estimation with higher precision of the model parameters of the related-art equivalent circuit model formed of the DC resistor, CR parallel elements, and the like. The general equivalent circuit model models an overvoltage having a time constant of no longer than about several hundreds of seconds and does not thus consider interparticle diffusion being a voltage relaxation process having a time constant equal to or longer than several hundreds of seconds, and accordingly has a lower precision in principle. In contrast, in the first embodiment, the interparticle diffusion having a long time constant can highly precisely be estimated and predicted. As an inevitable result, a shorter process, that is, equivalent circuit parameters reflecting an electrolytic solution resistance, a charge transfer resistance, an intraparticle diffusion resistance, and the like can also highly precisely be estimated.

As described above, compared with the related art, it is also possible to simplify the model in accordance with conditions based on the physical model, to thereby reduce the model parameters, and the model parameters are also estimated. Thus, it is not required to acquire the model parameter values in advance.

Finally, as effects of the first embodiment, the voltage relaxation process can highly precisely be modeled, and the OCV can highly precisely be predicted. As a result, periods required to, for example, reset the SOC of the storage battery and acquire the SOC-OCV data are reduced. In addition, the resetting of the SOC of the storage battery and the acquisition of the SOC-OCV data can be executed highly precisely compared with the related art. This is an advantage in industrial application in terms of highly efficient use, an increase in operation rate, quick diagnosis of a degraded storage battery, and the like of a system to which the storage battery is mounted. Moreover, according to the first embodiment, the intraparticle diffusion and the interparticle diffusion can separately be estimated with high precision, and hence, in a publicly known measurement technology including a stop, for example, the galvanostatic intermittent titration technique (GITT), a storage battery model can highly precisely be built.

Figure 17:
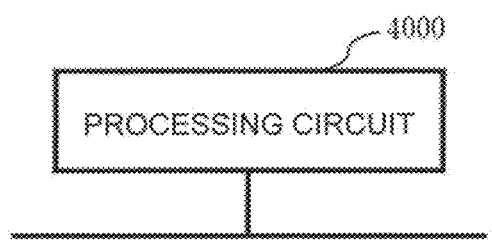
FIG. 17 is a configuration diagram for illustrating a case in which each function of the characteristic estimation device according to the first embodiment of the present invention is implemented by a processing circuit being dedicated hardware.
Figure 18:
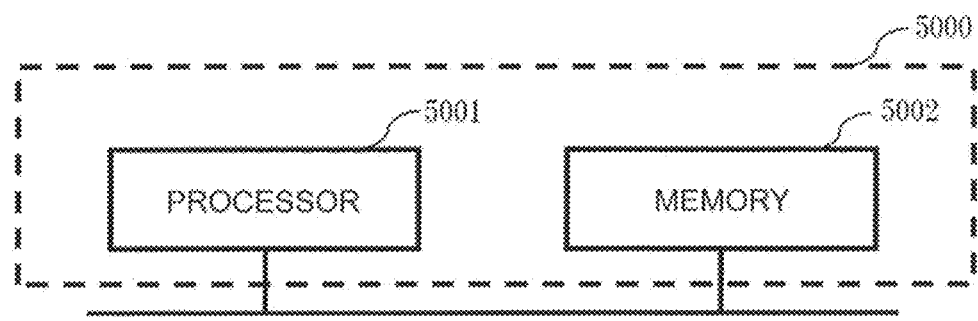
FIG. 18 is a configuration diagram for illustrating a case in which each function of the characteristic estimation device according to the first embodiment of the present invention is implemented by a processing circuit which includes a processor and a memory.

Each function of the characteristic estimation device according to the first embodiment of the present invention described above is implemented by a processing circuit. The processing circuit for implementing each function may be dedicated hardware, or a processor configured to execute a program stored in a memory. FIG. 17 is a configuration diagram for illustrating a case in which each function of the characteristic estimation device according to the first embodiment of the present invention is implemented by a processing circuit 4000 being dedicated hardware. Moreover, FIG. 18 is a configuration diagram for illustrating a case in which each function of the characteristic estimation device according to the first embodiment of the present invention is implemented by a processing circuit 5000 including a processor 5001 and a memory 5002.

When the processing circuit is dedicated hardware, the processing circuit 4000 corresponds to, for example, a single circuit, a composite circuit, a programmed processor, a parallel-programmed processor, an application specific integrated circuit (ASIC), a field programmable gate array (FPGA), or a combination thereof. The functions of the respective units of the characteristic estimation device may each be implemented by the individual processing circuit 4000, or may be implemented together by one processing circuit 4000. Moreover, data such as the time-series data and the diffusion fundamental solution models may be stored in the processing circuit 4000, or may be stored outside the processing circuit 4000, for example, on a cloud.

Meanwhile, when the processing circuit is the processor 5001, the functions of the respective units of the characteristic estimation device are implemented by software, firmware, or a combination of software and firmware. The software and the firmware are coded as a program and stored in the memory 5002. The processor 5001 reads out and executes the program stored in the memory 5002, to thereby implement the function of each of the units. That is, the characteristic estimation device includes the memory 5002 configured to store programs the execution of which by the processing circuit 5000 ultimately leads to the implementation of each of the control processes described above.

It is also understood that those programs cause a computer to execute the steps and methods described above for the respective units. In this case, the memory 5002 corresponds to, for example, a random access memory (RAM), a read only memory (ROM), a flash memory, an erasable programmable read only memory (EPROM), an electrically erasable and programmable read only memory (EEPROM), or other such non-volatile or volatile semiconductor memory. The memory 2002 also corresponds to, for example, a magnetic disk, a flexible disk, an optical disc, a compact disc, a MiniDisk, or a DVD. Moreover, data such as the time-series data and the diffusion fundamental solution models may be stored in the memory 5002, or may be stored, for example, on a cloud.

Some of the functions of the respective units described above may be implemented by dedicated hardware, and others thereof may be implemented by software or firmware.

In this manner, the processing circuit can implement the function of each of the units described above by hardware, software, firmware, or a combination thereof.

REFERENCE SIGNS LIST 100 characteristic estimation device, 101 storage battery, 102 voltage detection unit, 103 time-series data acquisition unit, 104 model provision unit, 105 model parameter estimation unit

The invention claimed is:
1. A characteristic estimation device for a storage battery, comprising:
  voltage detection circuitry to detect a terminal voltage of the storage battery;
  time-series data acquisition circuitry to acquire time-series data on the terminal voltage in a stopped state of the storage battery;
  model provision circuitry to provide a storage battery model that includes an OCV term for expressing OCV of the storage battery, and an interparticle diffusion term which is based on a fundamental solution of a one-dimensional diffusion equation expressing ion diffusion among particles forming an electrode of the storage battery; and model parameter estimation circuitry to estimate a model parameter of the storage battery model based on the time-series data on the terminal voltage acquired by the time-series data acquisition circuitry and on the storage battery model provided by the model provision circuitry.

2. The characteristic estimation device according to claim 1, wherein the interparticle diffusion term further includes a time shift parameter.

3. The characteristic estimation device according to claim 1, wherein the storage battery model further includes an intraparticle diffusion term which is based on a fundamental solution of a three-dimensional diffusion equation expressing ion diffusion in each of the particles forming the electrode of the storage battery.

4. The characteristic estimation device according to claim 2, wherein the storage battery model further includes an intraparticle diffusion term which is based on a fundamental solution of a three-dimensional diffusion equation expressing ion diffusion in each of the particles forming the electrode of the storage battery.

5. The characteristic estimation device according to claim 1, wherein the storage battery model further includes a term which is based on a battery equivalent circuit.

6. The characteristic estimation device according to claim 2, wherein the storage battery model further includes a term which is based on a battery equivalent circuit.

7. The characteristic estimation device according to claim 3, wherein the storage battery model further includes a term which is based on a battery equivalent circuit.

8. The characteristic estimation device according to claim 4, wherein the storage battery model further includes a term which is based on a battery equivalent circuit.

9. The characteristic estimation device according to claim 1, further comprising:

circuitry configured to reset a state of charge of the storage battery, after the model parameter estimation circuitry estimates the model parameter of the storage battery model.

10. A characteristic estimation method for a storage battery, comprising:

detecting, using voltage detection circuitry, a terminal voltage of the storage battery;

acquiring, using time-series data acquisition circuitry, time-series data on the terminal voltage in a stopped state of the storage battery, and being stored the time-series data in a memory;

providing, using model provision circuitry, a storage battery model and storing the storage battery model in the memory, that includes an OCV term for expressing OCV of the storage battery, and an interparticle diffusion term which is based on a fundamental solution of a one-dimensional diffusion equation expressing ion diffusion among particles forming an electrode of the storage battery; and estimating, using model parameter estimation circuitry, a model parameter of the storage battery model based on the time-series data on the terminal voltage and on the storage battery model stored in the memory.

11. The characteristic estimation method according to claim 10, wherein the interparticle diffusion term further includes a time shift parameter.

12. The characteristic estimation method according to claim 10, wherein the storage battery model further includes an intraparticle diffusion term which is based on a fundamental solution of a three-dimensional diffusion equation expressing ion diffusion in each of the particles forming the electrode of the storage battery.

13. The characteristic estimation method according to claim 11, wherein the storage battery model further includes an intraparticle diffusion term which is based on a fundamental solution of a three-dimensional diffusion equation expressing ion diffusion in each of the particles forming the electrode of the storage battery.

14. The characteristic estimation method according to claim 10, wherein the storage battery model further includes a term which is based on a battery equivalent circuit.

15. The characteristic estimation method according to claim 11, wherein the storage battery model further includes a term which is based on a battery equivalent circuit.

16. The characteristic estimation method according to claim 12, wherein the storage battery model further includes a term which is based on a battery equivalent circuit.

17. The characteristic estimation method according to claim 13, wherein the storage battery model further includes a term which is based on a battery equivalent circuit.

* * * * *